US012689177B2

(12) United States Patent
Shi et al.

(10) Patent No.: US 12,689,177 B2
(45) Date of Patent: Jul. 21, 2026

(54) EMITTER ASSEMBLY WITH A REDISTRIBUTION LAYER FOR A VERTICAL CAVITY SURFACE EMITTING LASER (VCSEL) CHIP

(71) Applicant: Lumentum Operations LLC, San Jose, CA (US)

(72) Inventors: Wei Shi, San Jose, CA (US); Joseph Leigh, Santa Clara, CA (US); Eric R. Hegblom, Sunnyvale, CA (US); Suhit Ranjan Das, San Jose, CA (US); Huanlin Zhu, San Jose, CA (US); Raman Srinivasan, Fremont, CA (US); Gianluca Bacchin, Albuquerque, NM (US); Yuefa Li, San Jose, CA (US); Jacob U. Lopez Ruvalcaba, Albuquerque, NM (US); Lijun Zhu, Dublin, CA (US); Qianhuan Yu, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 578 days.

(21) Appl. No.: 18/194,123

(22) Filed: Mar. 31, 2023

(65) Prior Publication Data

US 2024/0195145 A1     Jun. 13, 2024

Related U.S. Application Data

(60) Provisional application No. 63/386,527, filed on Dec. 8, 2022.

(51) Int. Cl.
*H01S 5/0234*     (2021.01)
*H01S 5/02315*     (2021.01)
(Continued)

(52) U.S. Cl.
CPC ........ *H01S 5/0234* (2021.01); *H01S 5/02315* (2021.01); *H01S 5/0237* (2021.01);
(Continued)

(58) Field of Classification Search
CPC ...... H01S 5/423; H01S 5/0234; H01S 5/0237; H01S 5/02375
See application file for complete search history.

(56) References Cited

U.S. PATENT DOCUMENTS

| | | | |
|---|---|---|---|
| 5,319,725 A | 6/1994 | Buchmann et al. | |
| 5,909,524 A | 6/1999 | Tabuchi | |

(Continued)

OTHER PUBLICATIONS

Oppermann et al., Passive alignment flip chip assembly using surface tension of liquid solder and micromechanical stops, Proc. of SPIE vol. 5716 p. 19 (Jan. 2005) (Year: 2005).*

(Continued)

*Primary Examiner* — James A Menefee
(74) *Attorney, Agent, or Firm* — Harrity & Harrity, LLP

(57) ABSTRACT

In some implementations, an emitter assembly includes a vertical cavity surface emitting laser (VCSEL) chip including a plurality of VCSELs respectively associated with a plurality of first electrical contacts. A first spacing of the plurality of first electrical contacts may define a first pitch. The emitter assembly may include a redistribution layer, disposed on the VCSEL chip, to increase the first pitch of the plurality of first electrical contacts. The emitter assembly may include a carrier having a plurality of second electrical contacts. A second spacing of the plurality of second electrical contacts may define a second pitch greater than the first pitch. The emitter assembly may include a plurality of conductive pillars that electrically connect the plurality of first electrical contacts and the plurality of second electrical contacts via the redistribution layer. The plurality of conductive pillars may be arranged according to the second spacing.

20 Claims, 5 Drawing Sheets

200 ⟶

(51) Int. Cl.
  *H01S 5/0237*          (2021.01)
  *H01S 5/02375*        (2021.01)
  *H01S 5/183*            (2006.01)
  *H01S 5/42*              (2006.01)
  *H01S 5/042*            (2006.01)

(52) U.S. Cl.
  CPC ...... *H01S 5/02375* (2021.01); *H01S 5/18305*
        (2013.01); *H01S 5/423* (2013.01); *H01S*
                              *5/04257* (2019.08)

(56)                    References Cited

U.S. PATENT DOCUMENTS 9,798,087 B1    10/2017  Mathai et al.
2003/0011851 A1*   1/2003  Trezza ................... H01S 5/423
                                                        398/141

2011/0085760  A1      4/2011  Han et al.
2018/0358778  A1     12/2018  Barwicz et al.
2020/0169065  A1*    5/2020  Carson ................... H01S 5/423
2020/0412086  A1     12/2020  Tsuji
2020/0412089  A1     12/2020  Mori et al.
2021/0399523  A1     12/2021  Ishida et al.
2022/0021189  A1*    1/2022  Sperl ................... H01S 5/18341
2023/0085957  A1*    3/2023  Hotellier ............ H01S 5/18305
                                                        372/38.02

OTHER PUBLICATIONS

Gao et al., "Chip to Wafer Hybrid Bonding with Cu Interconnect: High Volume Manufacturing Process Compatibility Study," Proceedings of the International Wafer-Level Packaging Conference, 2019, 9 Pages.

* cited by examiner

400

206          204                    206          204

405

205

410                                                            211

216    214        216    214

415                                                            211

222

220

420

214

212

Emission Direction

FIG. 4

Assemble a VCSEL chip in a flip chip configuration with a carrier to produce an emitter assembly

510

Perform a solder reflow procedure on the emitter assembly

520

500

EMITTER ASSEMBLY WITH A REDISTRIBUTION LAYER FOR A VERTICAL CAVITY SURFACE EMITTING LASER (VCSEL) CHIP

CROSS-REFERENCE TO RELATED APPLICATION

This Patent Application claims priority to U.S. Provisional Patent Application No. 63/386,527, filed on Dec. 8, 2022, and entitled "MASS REFLOW OF A VERTICAL CAVITY SURFACE EMITTING LASER ON AN INTEGRATED CIRCUIT CHIP." The disclosure of the prior Application is considered part of and is incorporated by reference into this Patent Application.

TECHNICAL FIELD

The present disclosure relates generally to vertical cavity surface emitting lasers (VCSELs) and to an emitter assembly with a redistribution layer for a VCSEL chip.

BACKGROUND

A vertical-emitting laser device, such as a VCSEL, is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

In some implementations, an emitter assembly includes a VCSEL chip including a plurality of VCSELs in a bottom-emitting configuration. The plurality of VCSELs may be respectively associated with a plurality of first electrical contacts, and a first spacing of the plurality of first electrical contacts may define a first pitch. The emitter assembly may include a redistribution layer, disposed on the VCSEL chip, to increase the first pitch of the plurality of first electrical contacts. A perimeter of the VCSEL chip may extend at least to a perimeter of the redistribution layer. The emitter assembly may include a carrier having a plurality of second electrical contacts. A second spacing of the plurality of second electrical contacts may define a second pitch greater than the first pitch. The VCSEL chip may be in a flip chip configuration with the carrier. The emitter assembly may include a plurality of conductive pillars that electrically connect the plurality of first electrical contacts and the plurality of second electrical contacts via the redistribution layer. The plurality of conductive pillars may be arranged according to the second spacing that defines the second pitch.

In some implementations, an emitter assembly includes a VCSEL chip including a plurality of VCSELs. The plurality of VCSELs may be respectively associated with a plurality of first electrical contacts, and a first spacing of the plurality of first electrical contacts may define a first pitch. The emitter assembly may include a redistribution layer, disposed on the VCSEL chip, to increase the first pitch of the plurality of first electrical contacts. The emitter assembly may include a carrier having a plurality of second electrical contacts. A second spacing of the plurality of second electrical contacts may define a second pitch greater than the first pitch. The emitter assembly may include a plurality of conductive pillars that electrically connect the plurality of first electrical contacts and the plurality of second electrical contacts via the redistribution layer. The plurality of conductive pillars may be arranged according to the second spacing that defines the second pitch.

In some implementations, a method includes assembling a VCSEL chip in a flip chip configuration with a carrier to produce an emitter assembly. The VCSEL chip may include a plurality of first electrical contacts for a plurality of VCSELs of the VCSEL chip, and a first spacing of the plurality of first electrical contacts may define a first pitch. The carrier may include a plurality of second electrical contacts, and a second spacing of the plurality of second electrical contacts may define a second pitch greater than the first pitch. A redistribution layer to increase the first pitch of the plurality of first electrical contacts may be disposed on the VCSEL chip, the redistribution layer being configured to electrically connect the plurality of first electrical contacts and the plurality of second electrical contacts via a plurality of conductive pillars arranged according to the second spacing that defines the second pitch. The method may include performing a solder reflow procedure on the emitter assembly.

BRIEF DESCRIPTION OF THE DRAWINGS

FIG. 4 is a diagram of an example associated with forming a redistribution layer and conductive pillars on an emitter assembly.

DETAILED DESCRIPTION

Figures 1A, 1B:
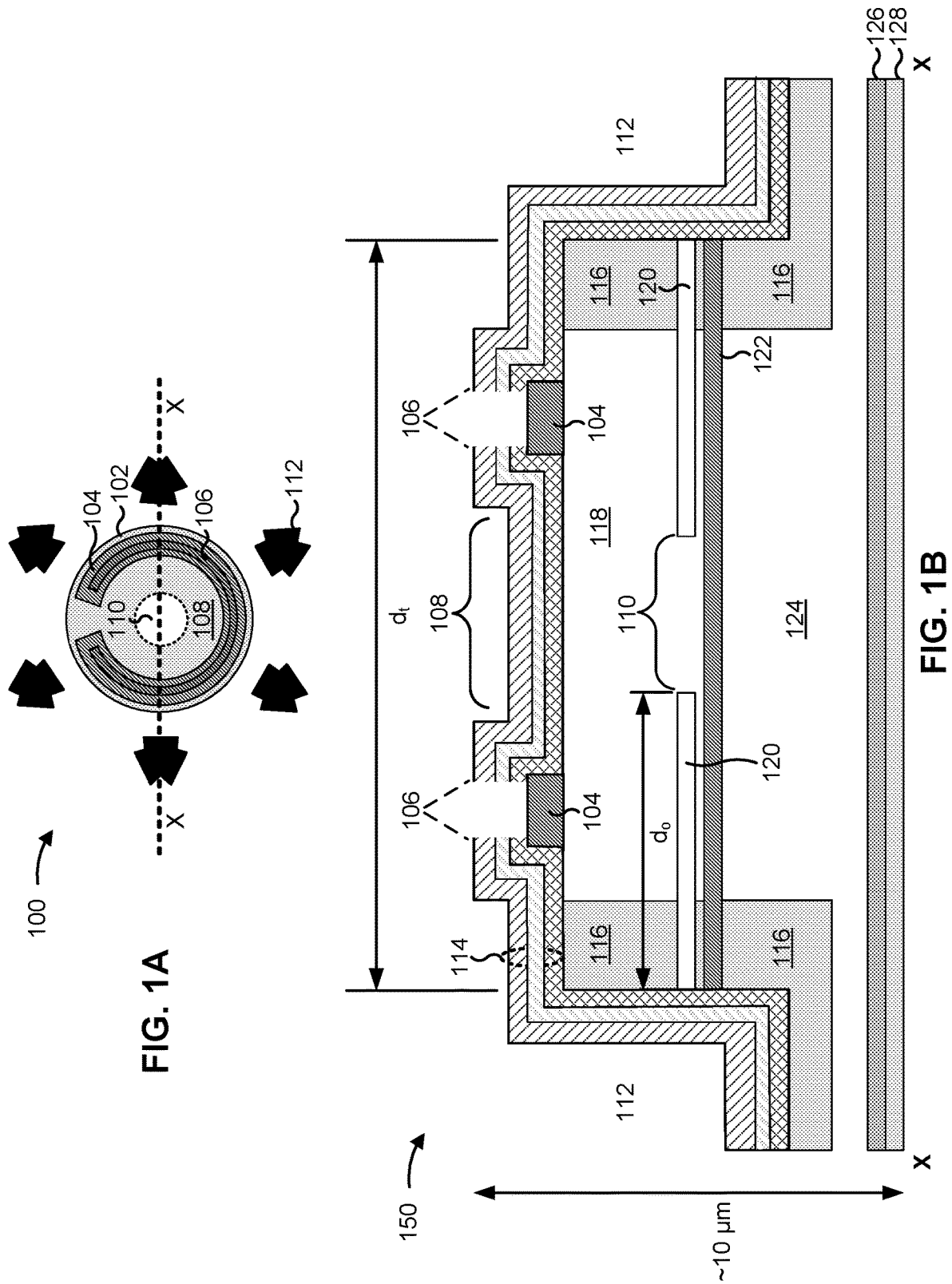
FIGS. 1A and 1B are diagrams illustrating a top-view of an example emitter and a cross-sectional view of the example emitter along line X-X, respectively.

The following detailed description of example implementations refers to the accompanying drawings. The same reference numbers in different drawings may identify the same or similar elements.

In some examples, a top-emitting vertical cavity surface emitting laser (VCSEL) chip may be mounted on a substrate side-by-side with an integrated circuit (IC) driver chip for the VCSEL chip and connected by wire bonding and substrate traces. In some other examples, a bottom-emitting VCSEL chip may be flip chip bonded on an IC driver chip (which may be referred to as a VCSEL-on-driver (VoD) configuration), thereby shortening connections between the VCSEL chip and the IC driver chip and improving control over the VCSEL chip. A time-of-flight (ToF) camera may include such a VoD device to achieve improved three-dimensional (3D) sensing accuracy.

In a VoD device, an emitter pitch of a VCSEL chip may be in a range from approximately 35 micrometers (μm) to 50 μm depending on particular optical requirements for the VoD device. However, a pitch of electrical contacts (e.g., solder bumps or bond pads) of an IC driver chip of the VoD device may be 45 μm or greater (e.g., 60 μm). In other words, the VCSEL chip may have a finer pitch than the IC driver chip. In some cases, to resolve the mismatch in pitches, the pitch of the electrical contacts of the IC driver chip may be redistributed to match the pitch of the VCSEL chip by wafer reconstruction of the IC driver chip using a redistribution layer (RDL). In other words, the redistribution layer may provide reduction of the pitch of the electrical contacts of the IC driver chip. In some examples, conductive (e.g., copper (Cu)) pillars may be used for connecting the VCSEL chip to the IC driver chip.

When these conductive pillars have a fine pitch, achieving passive alignment using solder reflow in mass production is difficult because vibration in a transfer belt or a reflow oven belt may misalign the VCSEL chip before the solder is melted. Thus, for smaller pitches (e.g., 45 μm or less), bonding of the VCSEL chip to the IC chip may be achieved using thermal compression bonding (TCB) with active alignment rather than conventional solder mass reflow. Compared to solder mass reflow, TCB is complex, expensive, and associated with a low throughput, such as a low units per hour (UPH). For example, TCB may involve a temperature ramp-up and cooling down of a bonding head, which can be slow, resulting in low throughput. In some examples, chip-on-wafer TCB bonding of VCSEL chips to an IC wafer may be used to improve throughput. However, chip-on-wafer TCB bonding may be unsuitable for various solders (e.g., tin/silver solders) because the bonding temperature may remelt the solder of neighboring chips.

Some implementations described herein enable the use of solder mass reflow for an emitter assembly having an array of VCSELs arranged with a fine pitch. In some implementations, the emitter assembly may include a carrier (e.g., an IC chip, a circuit board, or the like), a VCSEL chip in a flip chip configuration with the carrier, and a redistribution layer disposed on the VCSEL chip. The redistribution layer may be configured to redistribute electrical contacts for the VCSELs over a larger area, and a perimeter of the VCSEL chip may extend at least to a perimeter of the redistribution layer (e.g., the emitter assembly may be free of a molding compound typically used for fan-out wafer-level packaging (FOWLP) devices). The redistribution layer may increase the pitch of the electrical contacts for the VCSELs to match a pitch of electrical contacts of the carrier. In this way, the emitter assembly may include larger conductive pillars for electrically connecting the VCSEL chip and the carrier, and the larger pillars may be suitable for solder mass reflow. Accordingly, the emitter assembly may be manufactured with a reduced cost and complexity and at a greater throughput using solder mass reflow.

FIGS. 1A and 1B are diagrams illustrating a top-view of an example emitter 100 and a cross-sectional view 150 of the example emitter 100 along line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g., a dielectric layer or a passivation layer) of emitter 100, and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium gray area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations may be used, such as a compact emitter that includes five trenches 112, seven trenches 112, or another quantity of trenches. In some implementations, trenches 112 may encircle emitter 100 to form a mesa structure $d_t$ (shown in FIG. 1B). As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are contemplated. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, and/or emission profile. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g., a dielectric passivation/mirror layer), and an ohmic metal layer 104. As shown, emitter 100 may have, for example, a total height that is approximately 10 micrometers ($\mu$m).

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or another type of semiconductor layer.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 m to approximately 20 m. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as $d_o$ in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer, and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor, may provide a non-rectifying electrical junction, and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B are provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100, and any layer may comprise more than one layer.

Figure 2:
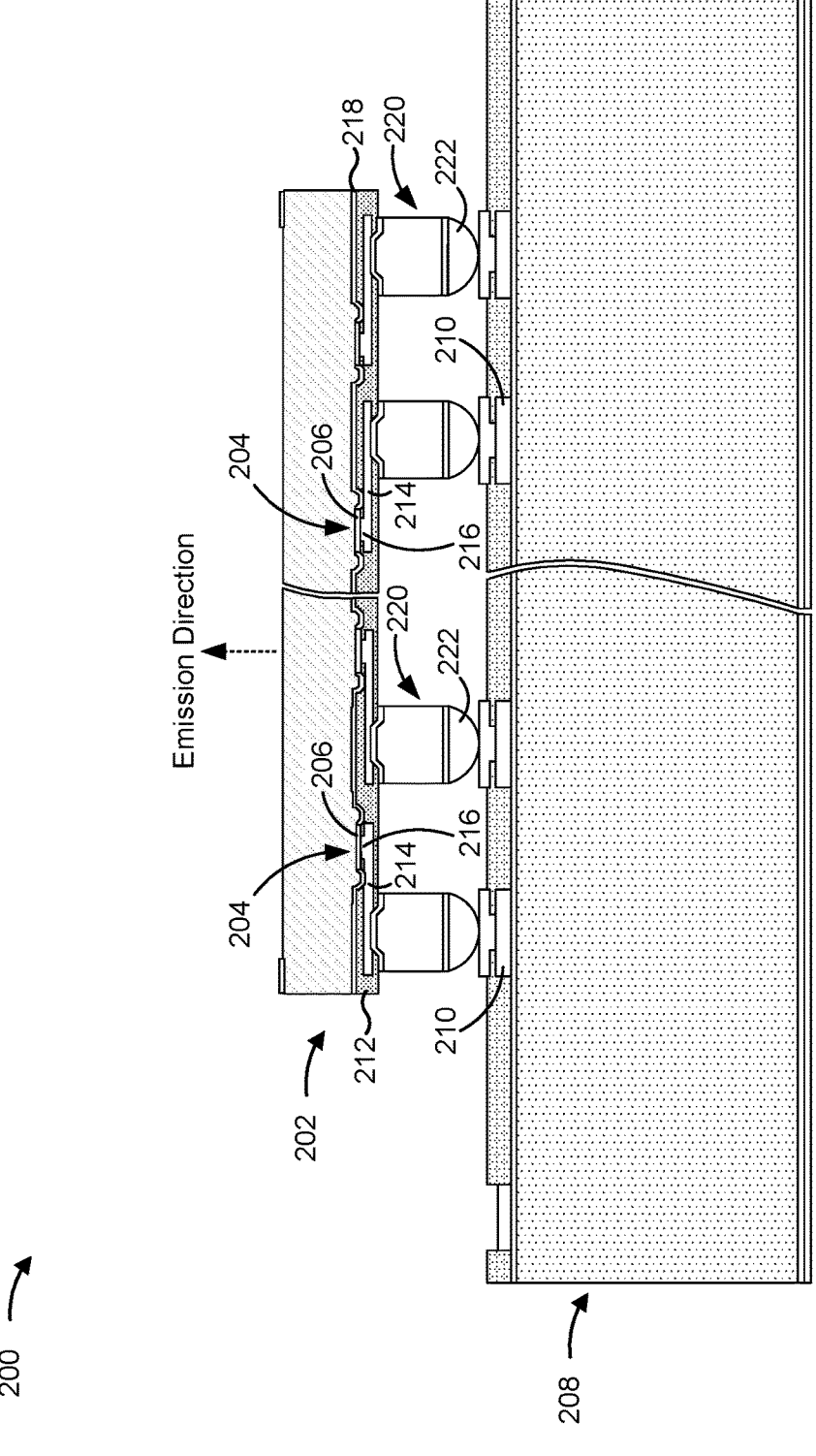
FIG. 2 shows a sectional view of an example emitter assembly.

FIG. 2 shows a sectional view of an example emitter assembly 200. The emitter assembly 200 may include a VCSEL chip 202 (e.g., a VCSEL device). The VCSEL chip 202 may include a plurality of VCSELs 204 (i.e., a VCSEL array). For example, the VCSEL chip 202 may include a semiconductor die with the VCSELs 204 formed therein. In some implementations, the VCSELs 204 may be arranged in a plurality of rows, and alternating rows may be shifted relative to each other (e.g., as shown in FIG. 3A). The VCSELs 204 may be configured in a similar manner as described in connection with FIGS. 1A-1B. In some implementations, the VCSELs 204 may be in a bottom-emitting configuration. For example, in a bottom-emitting configuration, a top of a VCSEL 204 may be covered by an electrical contact (e.g., a bond pad), and the VCSEL 204 may emit light down through a substrate of the VCSEL 204.

The VCSELs 204 may be respectively associated with a plurality of first electrical contacts 206 (e.g., bond pads) in a similar manner as described in connection with FIGS.

1A-1B. A location of an electrical contact 206 of a VCSEL 204 may dictate a location of an emission area of the VCSEL 204. A first spacing of the first electrical contacts 206 from each other (from centers of the first electrical contacts 206) may define a first pitch associated with the VCSEL chip 202. Stated differently, the first spacing of the VCSELs 204 may define the first pitch associated with the VCSEL chip 202.

The emitter assembly 200 may include a carrier 208 for the VCSEL chip 202. The carrier 208 may be an IC chip (e.g., a driver chip for the VCSEL chip 202), a substrate (e.g., a circuit board, such as a printed circuit board), or the like. For example, the emitter assembly 200 may include a VoD device. The carrier 208 may include a plurality of second electrical contacts 210 (e.g., bond pads). A second spacing of the second electrical contacts 210 from each other (from centers of the second electrical contacts 210) may define a second pitch associated with the carrier 208. The second pitch may be different from the first pitch. For example, the second pitch may be greater than the first pitch. In some implementations, the first pitch may be less than 45 μm (e.g., 40 μm), which may be referred to as a "fine pitch," and the second pitch may be greater than or equal to 45 μm (e.g., 60 μm).

A redistribution layer 212 may be disposed on the VCSEL chip 202 to resolve the difference between the first pitch and the second pitch. The redistribution layer 212 may include a dielectric material, such as polyimide, or $SiO_2$. The redistribution layer 212 may increase the first pitch of the first electrical contacts 206 of the VCSEL chip 202. In particular, the redistribution layer 212 may include (e.g., in the polyimide) a plurality of conductive traces 214 (e.g., composed of copper, aluminum, gold, and/or silver, among other examples) configured to redistribute the first electrical contacts 206 over a larger area. In some implementations, the redistribution layer 212 may include a plurality of vias 216 respectively connected to the first electrical contacts 206. Moreover, the conductive traces 214 may be respectively connected to the vias 216. In some implementations, an isolation layer 218 may be disposed on the VCSEL chip 202 between the redistribution layer 212 and the VCSEL chip 202. For example, the isolation layer 218 may include silicon nitride.

In some implementations, the VCSEL chip 202 may be in a flip chip configuration (i.e., a direct chip attach configuration) with the carrier 208. That is, the VCSEL chip 202 may be disposed on the carrier 208. In some implementations, the emitter assembly 200 may include a plurality of conductive pillars 220 (e.g., posts, columns, or the like) that connect the VCSEL chip 202 and the carrier 208. The conductive pillars 220 may include a metal, such as copper, silver, gold, or the like. A conductive pillar 220 may include a solder cap 222 (e.g., composed of a tin/silver solder) at an end of the conductive pillar 220 (e.g., with a nickel layer between the conductive pillar 220 and the solder cap 222).

The conductive pillars 220 may be arranged according to the second spacing that defines the second pitch associated with the carrier 208. Thus, the conductive pillars 220 may electrically connect the first electrical contacts 206 and the second electrical contacts 210 via the redistribution layer 212. For example, first ends of the conductive pillars 220 may be electrically and mechanically connected to the conductive traces 214 of the redistribution layer 212 (and electrically connected to the first electrical contacts 206 via the conductive traces 214), and second ends of the conductive pillars 220 may be electrically and mechanically connected to the second electrical contacts 210. As an example, the redistribution layer 212 may be disposed on the VCSEL chip 202 between the VCSEL chip 202 and the conductive pillars 220, and the redistribution layer 212 may electrically connect the first electrical contacts 206, with the first pitch, and the conductive pillars 220 with the second pitch. In some implementations, the conductive pillars 220 may extend from the redistribution layer 212 to the carrier 208 (e.g., the solder caps 222 may be on the side of the carrier 208, as shown). In some implementations, the conductive pillars 220 may extend from the carrier 208 to the redistribution layer 212 (e.g., the solder caps 222 may be on the side of the redistribution layer 212).

By using the redistribution layer 212 and increasing the pitch associated with the VCSEL chip 202, discrepancies between the first pitch of the first electrical contacts 206 and the second pitch of the second electrical contacts 210 may be resolved. Additionally, increasing the pitch associated with the VCSEL chip 202 facilities the use of conventional solder reflow on the emitter assembly 200. Moreover, the conductive pillars 220 may have a larger diameter than the conductive pillars 220 otherwise would have if the redistribution layer 212 is not used. For example, each of the conductive pillars 220 may have a maximum diameter greater than or equal to 25 μm (e.g., 30 μm), whereas the conductive pillars 220 may have a maximum diameter less than 25 μm if the redistribution layer 212 is not used. The larger conductive pillars 220 facilitate the use of conventional solder reflow on the emitter assembly 200.

In some implementations, side edges of the VCSEL chip 202, at a perimeter of the VCSEL chip 202, may be exposed. That is, the emitter assembly 200 may be free of molding (e.g., a fan-out area, as used in FOWLP) that surrounds the VCSEL chip 202 to increase a footprint of the VCSEL chip 202. For example, the perimeter of the VCSEL chip 202 may extend at least to a perimeter of the redistribution layer 212. In particular, a footprint of the VCSEL chip 202 may correspond to a footprint of the redistribution layer 212, and thus molding is not needed to increase the footprint of the VCSEL chip 202. While the footprint of the VCSEL chip 202 may correspond to the footprint of the redistribution layer 212, the VCSELs 204 may occupy a region of the VCSEL chip 202 having an area that is less than an overall area of the footprint of the VCSEL chip 202. For example, the area of the region of the VCSEL chip 202 occupied by the VCSELs 204 may be 50% or less of the overall area of the footprint of the VCSEL chip 202, thereby resulting in unused space on the VCSEL chip 202. This unused space may allow for the use of the redistribution layer 212 to increase the pitch of the first electrical contacts 206 without the use of molding (e.g., fan-in wafer-level packaging (FIWLP), with increased pitch using the redistribution layer 212).

In this way, the emitter assembly 200 may be suitable for using cost-effective and efficient solder reflow to bond the VCSEL chip 202 and the carrier 208. Accordingly, the emitter assembly 200 may be manufactured with reduced cost and complexity and with improved throughput. In some implementations, TCB may be used for bonding the VCSEL chip 202 and the carrier 208.

As indicated above, FIG. 2 is provided as an example. Other examples may differ from what is described with regard to FIG. 2.

Figure 3B:
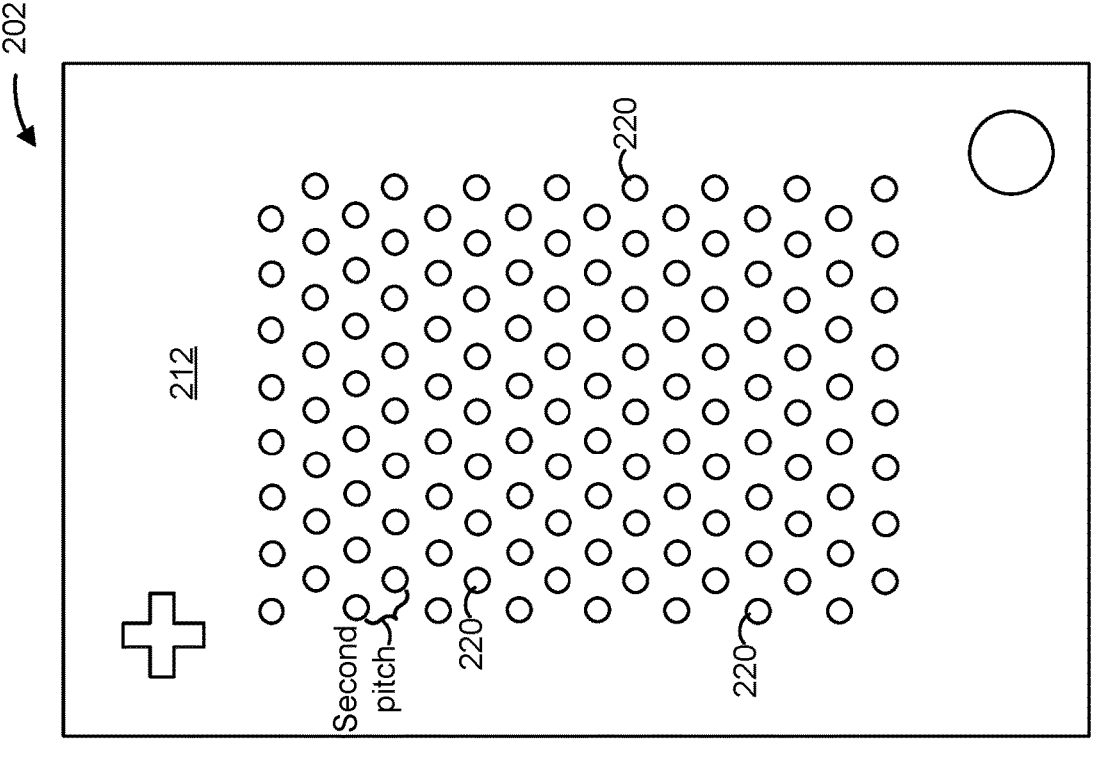
FIG. 3B shows a top view of an example redistribution layer and conductive pillars connected to a VCSEL chip.
Figure 3A:
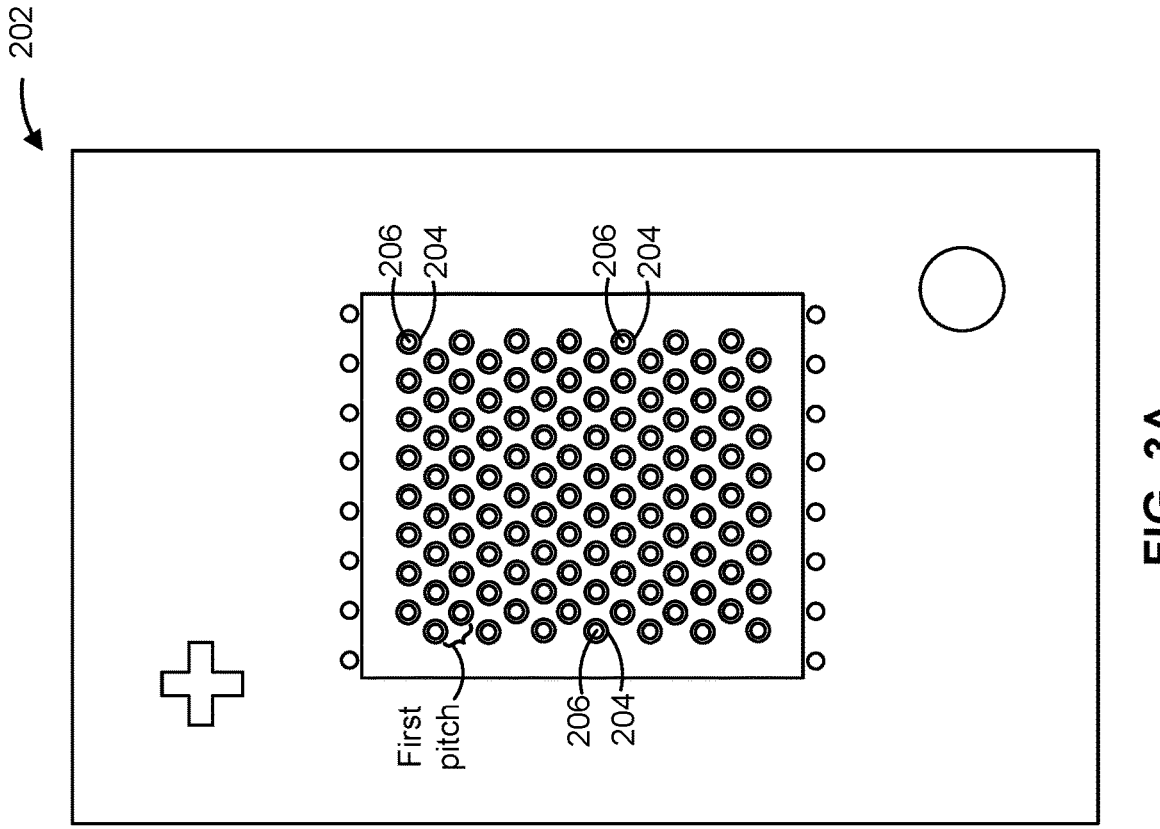
FIG. 3A shows a top view of an example VCSEL chip without a redistribution layer.

FIG. 3A shows a top view of an example of the VCSEL chip 202 without the redistribution layer 212 and FIG. 3B shows a top view of an example of the redistribution layer 212 and conductive pillars 220 connected to the VCSEL chip 202. FIG. 3A shows the VCSEL chip 202, and particularly the pitch of the first electrical contacts 206 (e.g., pads), before the redistribution layer 212 is formed on the VCSEL chip 202. FIG. 3B shows the redistribution layer 212, and particularly the pitch of the conductive pillars 220, after forming the redistribution layer 212 on the VCSEL chip 202.

As shown in FIG. 3A, the VCSELs 204 may be arranged in a plurality of rows, and alternating rows may be shifted relative to each other. As further shown in FIG. 3A, the first spacing of first electrical contacts 206 from each other (from centers of the first electrical contacts 206) may define the first pitch associated with the VCSEL chip 202. For example, the first pitch may be less than 45 μm (e.g., 40 μm), as described herein. Moreover, the fine pitch of the first electrical contacts 206 may restrict a diameter of the first electrical contacts 206 (e.g., to 19 μm).

As shown in FIG. 3B, the conductive pillars 220 may be connected to the redistribution layer 212 that is configured to redistribute the first electrical contacts 206 over a larger area. The second spacing of the conductive pillars 220 from each other, according to this redistribution, may be in the second pitch associated with the second electrical contacts 210 of the carrier 208. For example, the second pitch may be greater than or equal to 45 μm (e.g., 60 μm), as described herein. Moreover, a diameter of the conductive pillars 220 (e.g., 30 μm) may be greater than a diameter of the first electrical contacts 206. Based on the greater pitch and greater diameter of the conductive pillars 220, solder reflow may be used for the emitter assembly 200.

As indicated above, FIG. 3A-3B are provided as an example. Other examples may differ from what is described with regard to FIGS. 3A-3B.

Figure 4:
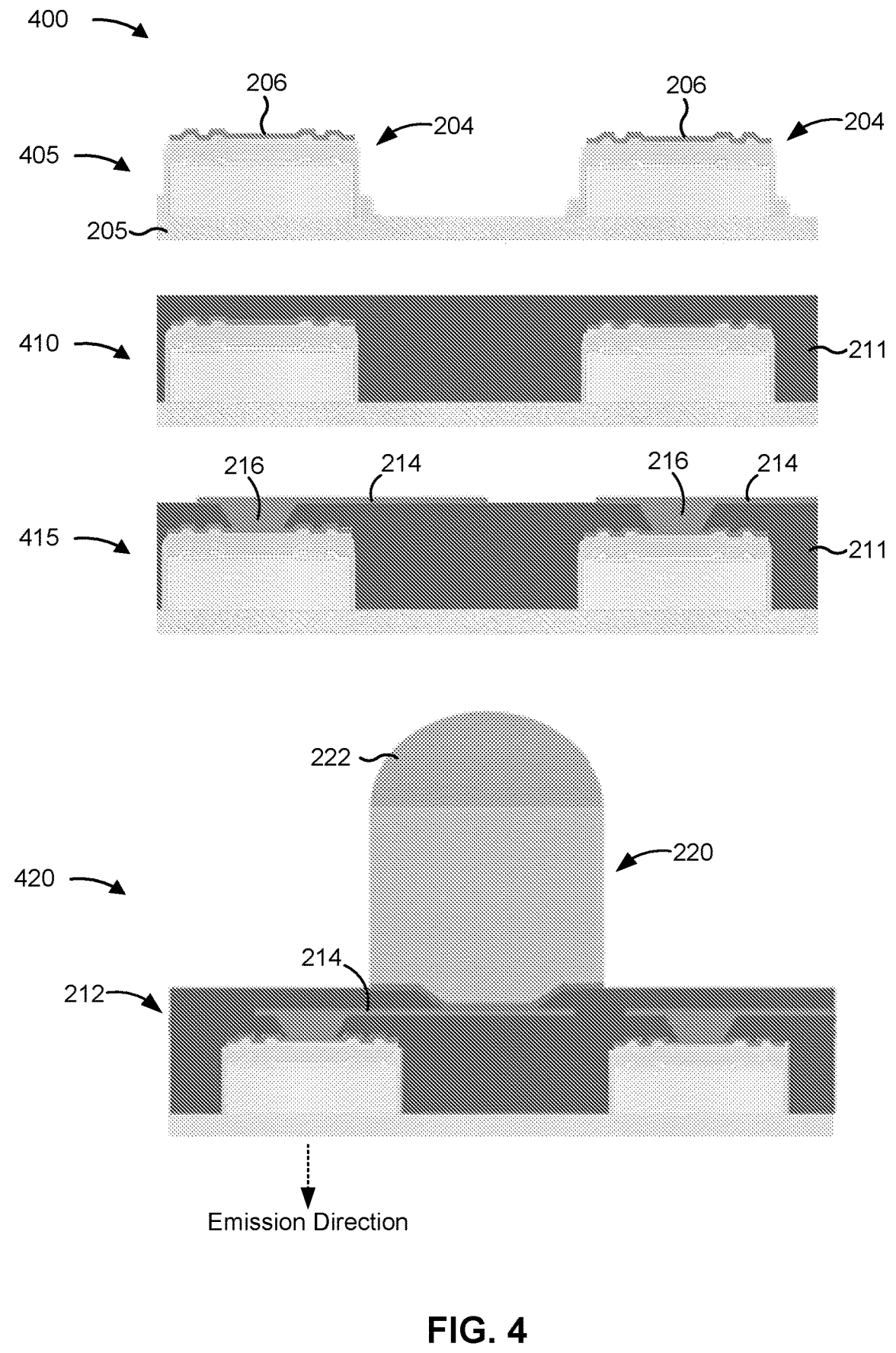

FIG. 4 is a diagram of an example 400 associated with forming the emitter assembly 200. In particular, example 400 relates to forming the redistribution layer 212 and conductive pillars 220 of the emitter assembly 200. As shown, the VCSELs 204 may be formed on a substrate 205. A VCSEL 204 may be formed by forming a set of epitaxial layers, in a similar manner as described in connection with FIGS. 1A-1B. In some implementations, the VCSELs 204 may in a bottom-emitting configuration.

As shown by reference number 405, an electrically-conductive layer (e.g., a metal layer, such as a copper layer) may be formed on top surfaces of the VCSELs 204 to form the first electrical contacts 206. As shown by reference number 410, an electrically-isolating layer 211 (e.g., a polymer layer, such as a polyimide layer, or a molding compound layer) may be formed on the VCSELs 204. For example, the electrically-isolating layer 211 may be formed by spin coating or molding.

As shown by reference number 415, the electrically-isolating layer 211 may be etched (e.g., in the case of polyimide) or laser-drilled (e.g., in the case of molding compound) followed by plating (e.g., copper plating) to form the vias 216 and trace patterning (e.g., using photolithography and/or etching) to form the conductive traces 214. The electrically-isolating layer 211, conductive traces 214, and vias 216 may together compose the redistribution layer 212.

As shown by reference number 420, a conductive pillar 220 may be formed on the redistribution layer 212 in electrical connection with a conductive trace 214. For example, the conductive pillar 220 may be formed by plating, sintering, additive printing, or the like. A solder cap 222 may be deposited at an end of the conductive pillar 220.

As indicated above, FIG. 4 is provided as an example. Other examples may differ from what is described with regard to FIG. 4.

Figure 5:
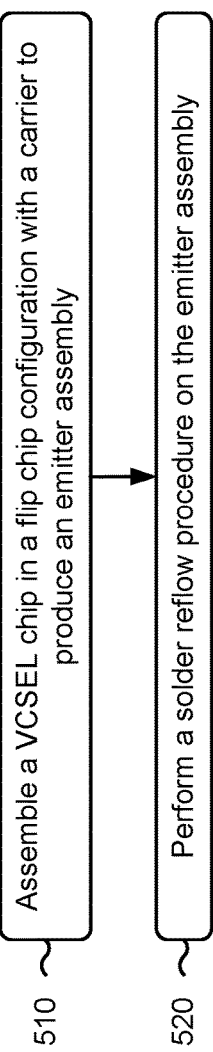
FIG. 5 is a flowchart of an example process associated with manufacturing an emitter assembly with a redistribution layer for a VCSEL chip.
Figure 5:

FIG. 5 is a flowchart of an example process 500 associated with manufacturing an emitter assembly with a redistribution layer for a VCSEL chip. In some implementations, one or more process blocks of FIG. 5 may be performed by various semiconductor manufacturing equipment, various circuit board assembly equipment, and/or various solder reflow equipment (e.g., which may include one or more conveyors and/or one or more reflow ovens).

As shown in FIG. 5, process 500 may include assembling a VCSEL chip in a flip chip configuration with a carrier to produce an emitter assembly (block 510). In some implementations, the VCSEL chip includes a plurality of first electrical contacts for a plurality of VCSELs of the VCSEL chip, and a first spacing of the plurality of first electrical contacts defines a first pitch. In some implementations, the carrier includes a plurality of second electrical contacts, and a second spacing of the plurality of second electrical contacts defines a second pitch greater than the first pitch. In some implementations, a redistribution layer to increase the first pitch of the plurality of first electrical contacts is disposed on the VCSEL chip, the redistribution layer being configured to electrically connect the plurality of first electrical contacts and the plurality of second electrical contacts via a plurality of conductive pillars arranged according to the second spacing that defines the second pitch. In some implementations, the redistribution layer is disposed on the VCSEL chip such that a perimeter of the VCSEL chip extends at least to a perimeter of the redistribution layer.

As further shown in FIG. 5, process 500 may include performing a solder reflow procedure on the emitter assembly (block 520). In some implementations, the VCSEL chip and the carrier are passively aligned in the solder reflow procedure. In some implementations, process 500 may include forming the VCSEL chip, forming the carrier, and/or forming an assembly that includes the emitter assembly.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An emitter assembly, comprising:
a vertical cavity surface emitting laser (VCSEL) chip comprising a plurality of VCSELs in a bottom-emitting configuration,
wherein the plurality of VCSELs are respectively associated with a plurality of first electrical contacts, and
wherein a first spacing of the plurality of first electrical contacts defines a first pitch;
a redistribution layer, disposed on the VCSEL chip, to increase the first pitch of the plurality of first electrical contacts,
wherein a perimeter of the VCSEL chip extends at least to a perimeter of the redistribution layer,
wherein, within the redistribution layer, at least one of the plurality of first electrical contacts is connected to a trace by a via within the redistribution layer;
a carrier having a plurality of second electrical contacts,
wherein a second spacing of the plurality of second electrical contacts defines a second pitch greater than the first pitch, and
wherein the VCSEL chip is in a flip chip configuration with the carrier; and
a plurality of conductive pillars that electrically connect the plurality of first electrical contacts and the plurality of second electrical contacts via the redistribution layer,
wherein at least one of the plurality of conductive pillars is connected to the trace within the redistribution layer, extends from the redistribution layer, and is arranged according to the second spacing that defines the second pitch.

2. The emitter assembly of claim 1, wherein side edges at the perimeter of the VCSEL chip are exposed.

3. The emitter assembly of claim 1, wherein the emitter assembly is free of molding surrounding the VCSEL chip.

4. The emitter assembly of claim 1, wherein the carrier comprises an integrated circuit chip or a substrate.

5. The emitter assembly of claim 1, wherein the plurality of conductive pillars extend from the redistribution layer to the carrier.

6. The emitter assembly of claim 1, wherein the plurality of conductive pillars extend from the carrier to the redistribution layer.

7. The emitter assembly of claim 1, wherein the first pitch is less than 45 micrometers and the second pitch is greater than or equal to 45 micrometers.

8. The emitter assembly of claim 1, wherein each conductive pillar, of the plurality of conductive pillars, has a maximum diameter greater than or equal to 25 micrometers.

9. An emitter assembly, comprising:
a vertical cavity surface emitting laser (VCSEL) chip comprising a plurality of VCSELs,
wherein the plurality of VCSELs are respectively associated with a plurality of first electrical contacts, and
wherein a first spacing of the plurality of first electrical contacts defines a first pitch;
a redistribution layer, disposed on the VCSEL chip, to increase the first pitch of the plurality of first electrical contacts,
wherein, within the redistribution layer, at least one of the plurality of first electrical contacts is connected to a trace by a via within the redistribution layer;
a carrier having a plurality of second electrical contacts, and
wherein a second spacing of the plurality of second electrical contacts defines a second pitch greater than the first pitch; and
a plurality of conductive pillars that electrically connect the plurality of first electrical contacts and the plurality of second electrical contacts via the redistribution layer,
wherein at least one of the plurality of conductive pillars is connected to the trace within the redistribution layer, extends from the redistribution layer, and is arranged according to the second spacing that defines the second pitch.

10. The emitter assembly of claim 9, wherein the plurality of VCSELs are in a bottom-emitting configuration, and
wherein the VCSEL chip is in a flip chip configuration with the carrier.

11. The emitter assembly of claim 9, wherein the redistribution layer includes a plurality of vias electrically connected respectively to the plurality of first electrical contacts, and
wherein the redistribution layer includes a plurality of conductive traces electrically connected respectively to the plurality of vias.

12. The emitter assembly of claim 9, wherein a perimeter of the VCSEL chip extends at least to a perimeter of the redistribution layer.

13. The emitter assembly of claim 12, wherein side edges at the perimeter of the VCSEL chip are exposed.

14. The emitter assembly of claim 9, wherein the emitter assembly is free of molding surrounding the VCSEL chip.

15. The emitter assembly of claim 9, wherein a region of the VCSEL chip occupied by the plurality of VCSELs is at most 50% of an overall area of the VCSEL chip.

16. The emitter assembly of claim 9, wherein the plurality of conductive pillars extend from the redistribution layer to the carrier.

17. The emitter assembly of claim 9, wherein the plurality of conductive pillars extend from the carrier to the redistribution layer.

18. A method, comprising:

assembling a vertical cavity surface emitting laser (VCSEL) chip in a flip chip configuration with a carrier to produce an emitter assembly, wherein the VCSEL chip comprises a plurality of first electrical contacts for a plurality of VCSELs of the VCSEL chip, and a first spacing of the plurality of first electrical contacts defines a first pitch, wherein the carrier comprises a plurality of second electrical contacts, and a second spacing of the plurality of second electrical contacts defines a second pitch greater than the first pitch, wherein a redistribution layer to increase the first pitch of the plurality of first electrical contacts is disposed on the VCSEL chip, the redistribution layer being configured to electrically connect the plurality of first electrical contacts and the plurality of second electrical contacts via a plurality of conductive pillars arranged according to the second spacing that defines the second pitch, wherein, within the redistribution layer, at least one of the plurality of first electrical contacts is connected to a trace by a via within the redistribution layer, and wherein at least one of the plurality of conductive pillars is connected to the trace within the redistribution layer, extends from the redistribution layer, and is arranged according to the second spacing that defines the second pitch; and performing a solder reflow procedure on the emitter assembly.

19. The method of claim 18, wherein the redistribution layer is disposed on the VCSEL chip such that a perimeter of the VCSEL chip extends at least to a perimeter of the redistribution layer.

20. The method of claim 18, wherein the VCSEL chip and the carrier are passively aligned in the solder reflow procedure.

* * * * *